(12) United States Patent
Abbasi Gavarti et al.

(10) Patent No.: US 11,137,299 B2
(45) Date of Patent: Oct. 5, 2021

(54) MULTI-AXIAL FORCE SENSOR INCLUDING PIEZORESISTIVE GROUPS, METHOD OF MANUFACTURING THE MULTI-AXIAL FORCE SENSOR, AND METHOD FOR OPERATING THE MULTI-AXIAL FORCE SENSOR

(71) Applicant: STMicroelectronics S.r.l., Agrate Brianza (IT)

(72) Inventors: Mohammad Abbasi Gavarti, Milan (IT); Daniele Caltabiano, Agrate Brianza (IT); Francesco Braghin, Varese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 10 days.

(21) Appl. No.: 16/019,092

(22) Filed: Jun. 26, 2018

(65) Prior Publication Data
US 2018/0372564 A1    Dec. 27, 2018

(30) Foreign Application Priority Data

Jun. 27, 2017 (IT) .................... 102017000071798

(51) Int. Cl.
*G01L 1/18* (2006.01)
*H01L 41/25* (2013.01)
(Continued)

(52) U.S. Cl.
CPC .............. *G01L 1/18* (2013.01); *G01L 1/2206* (2013.01); *G01L 1/2293* (2013.01); *G01L 1/26* (2013.01); *G01L 5/162* (2013.01); *H01L 41/25* (2013.01)

(58) Field of Classification Search
CPC ......... G01L 1/18; G01L 5/162; G01L 1/2293; G01L 1/2206
See application file for complete search history.

(56) References Cited

U.S. PATENT DOCUMENTS 4,483,203 A * 11/1984 Capper ................ G01G 3/1402
                                                                73/862.01
5,526,700 A *  6/1996 Akeel ....................... G01L 1/18
                                                                73/862.042
(Continued)

FOREIGN PATENT DOCUMENTS

CN        101900746 A      12/2010
CN        102636297 A       8/2012
(Continued)

OTHER PUBLICATIONS

Dao et al., "Development of a 3-DOF Silicon Piezoresistive Micro Accelerometer," Proceedings of the 2004 International Symposium on Micro-Nanomechatronics and Human Science, and the Fourth Symposium Micro-Nanomechatronics for Information-Based Society, Nogoya, Japan, Oct. 31-Nov. 3, 2004, 6 pages.

*Primary Examiner* — Tran M. Tran
(74) *Attorney, Agent, or Firm* — Seed IP Law Group LLP

(57) ABSTRACT

A microelectromechanical transducer includes a semiconductor body having first and second surfaces opposite to one another. A plurality of trenches extend in the semiconductor body from the first surface towards the second surface, including a first pair of trenches having a respective main direction of extension along a first axis, and a second pair of trenches having a respective main direction of extension along a second axis orthogonal to the first axis. A first piezoresistive sensor and a second piezoresistive sensor extend at the first surface of the semiconductor body respectively arranged between the first and second pair of trenches. The first piezoresistive sensor, the second piezoresistive sensor and the plurality of trenches form an active region. A first structural body is mechanically coupled to the first surface of the semiconductor body to form a first sealed cavity which encloses the active region.

13 Claims, 10 Drawing Sheets

(51) Int. Cl.
*G01L 1/22* (2006.01)
*G01L 5/162* (2020.01)
*G01L 1/26* (2006.01)

(56) References Cited

U.S. PATENT DOCUMENTS

| | | | | |
|---|---|---|---|---|
| 6,032,531 A * | 3/2000 | Roszhart | ............... | G01C 19/56 |
| | | | | 73/504.04 |
| 6,318,184 B1 * | 11/2001 | Kimerer, Jr. | ............. | G01B 7/16 |
| | | | | 73/772 |
| 6,772,632 B2 * | 8/2004 | Okada | ................. | B81B 3/0062 |
| | | | | 73/514.32 |
| 6,845,675 B2 * | 1/2005 | Meyer | ................ | G01L 5/161 |
| | | | | 73/862.041 |
| 7,458,281 B2 * | 12/2008 | Ohsato | ............... | G01L 5/162 |
| | | | | 73/862.041 |
| 8,024,977 B2 * | 9/2011 | Murari | ................ | G01L 1/02 |
| | | | | 73/727 |
| 8,067,769 B2 * | 11/2011 | Okudo | ............... | G01P 1/023 |
| | | | | 257/48 |
| 8,080,869 B2 * | 12/2011 | Okudo | ............... | B81B 7/0051 |
| | | | | 257/704 |
| 8,250,934 B2 * | 8/2012 | Sakurai | ............... | G01L 5/161 |
| | | | | 73/862.041 |
| 8,418,558 B2 * | 4/2013 | Kazama | .............. | G01P 1/023 |
| | | | | 73/514.33 |
| 8,881,596 B2 * | 11/2014 | Chiou | ............... | G01L 9/0042 |
| | | | | 73/721 |
| 8,931,347 B2 * | 1/2015 | Donzier | .............. | G01L 9/0054 |
| | | | | 73/706 |
| 10,336,605 B2 * | 7/2019 | Kim | .................. | B81B 3/0072 |
| 2003/0209075 A1 | 11/2003 | Okada | | |
| 2006/0272413 A1 | 12/2006 | Vaganov et al. | | |
| 2008/0227234 A1 | 9/2008 | Yoshino | | |
| 2009/0241671 A1 * | 10/2009 | Nomura | ............... | G01P 15/123 |
| | | | | 73/514.36 |
| 2010/0162823 A1 | 7/2010 | Hattori | | |
| 2010/0300205 A1 | 12/2010 | Kazama et al. | | |

FOREIGN PATENT DOCUMENTS

| | | |
|---|---|---|
| CN | 103487178 A | 1/2014 |
| EP | 1 653 208 A2 | 5/2006 |
| EP | 1 739 401 A1 | 1/2007 |
| JP | 63-169078 A | 7/1988 |
| JP | 2000-294520 A | 10/2000 |
| JP | 2010-185781 A | 8/2010 |

\* cited by examiner (Cross-Section of figure 2 at 1A)

(Cross-Section of figure 2 at 1B)

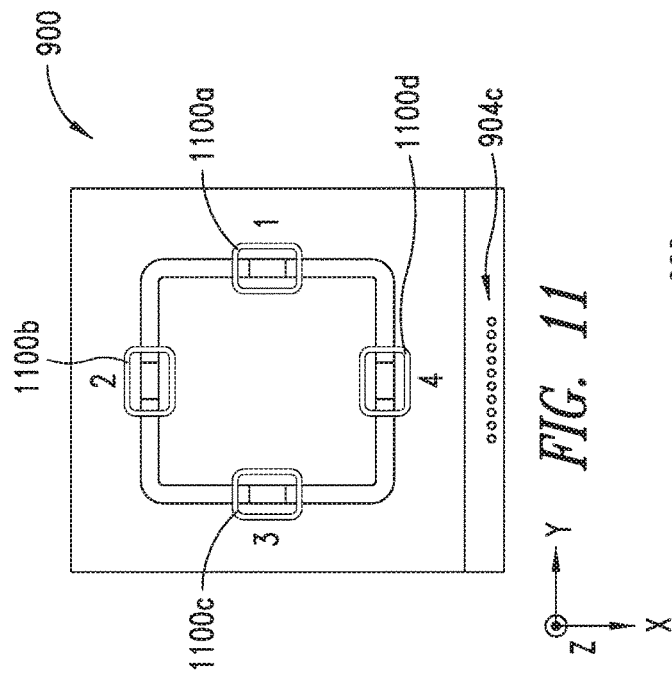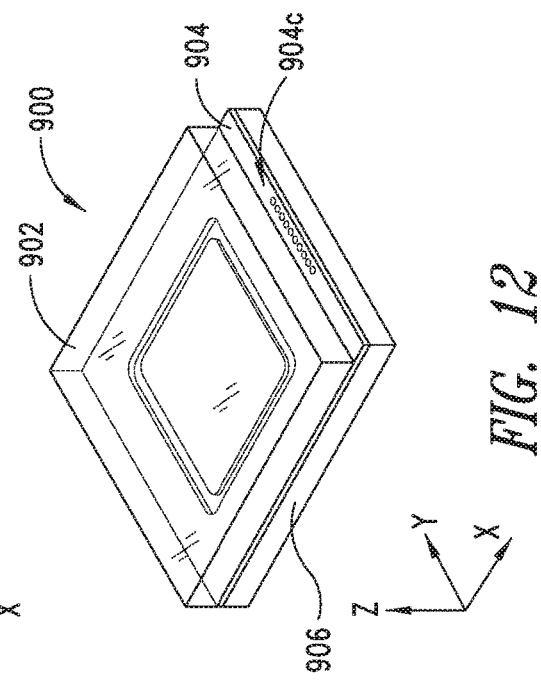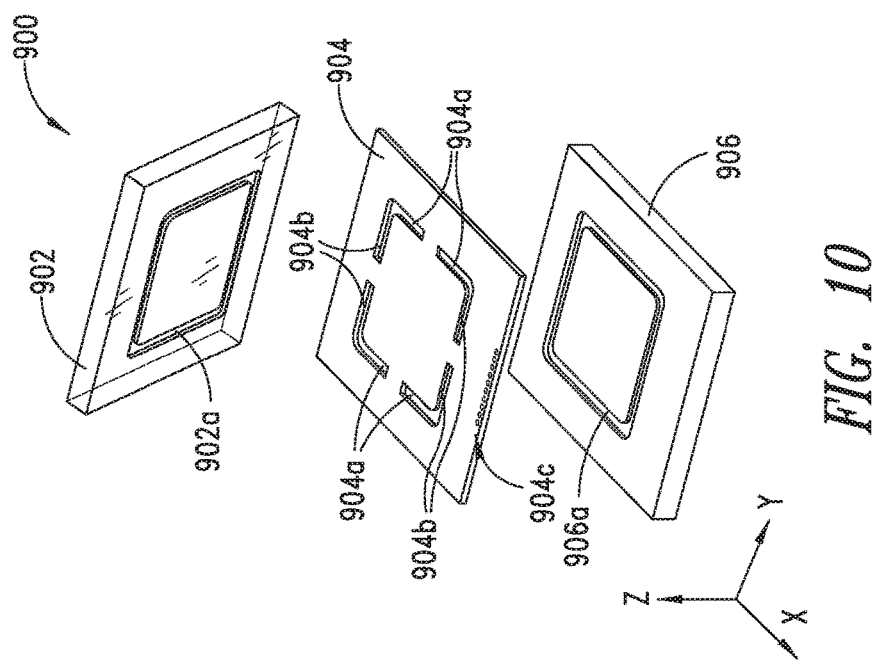

MULTI-AXIAL FORCE SENSOR INCLUDING PIEZORESISTIVE GROUPS, METHOD OF MANUFACTURING THE MULTI-AXIAL FORCE SENSOR, AND METHOD FOR OPERATING THE MULTI-AXIAL FORCE SENSOR

BACKGROUND

Technical Field

The present disclosure relates to a microelectromechanical transducer, a method of manufacturing the microelectromechanical transducer, and a method for operating the microelectromechanical transducer.

Description of the Related Art

As is known, integrated force sensors can be manufactured with micromachining techniques. These sensors typically comprise a thin membrane, or diaphragm, suspended over a cavity provided in a silicon body. Formed within the membrane are piezoresistive elements connected together to form a Wheatstone bridge. When subjected to a force, the membrane undergoes deformation, causing a variation of resistance of the piezoresistive elements, and thus an unbalancing of the Wheatstone bridge. As an alternative, capacitive sensors are available, where the membrane provides a first plate of a capacitor, whereas a second plate is provided by a fixed reference. During use, deflection of the membrane generates a variation of the capacitance of the capacitor, which may be detected and associated with the pressure exerted on the membrane.

However, these semiconductor sensors may not in themselves be used for measuring high pressures in so far as they typically have low full-scale values. Thus, for high-pressure and high force applications, they need quite a complex package to support the applied load.

Moreover, typical semiconductor force sensors are designed to measure mainly one component of force (e.g. the normal force), but not a combination of normal component with in-plane components (e.g. shear forces). As a consequence, there is a need for a low-cost and versatile technology for the fabrication of semiconductor force sensors that sense multi-axial loads, able to measure or compensate different applied load components or non-homogeneous residual stresses induced on the sensor structure.

Multi-axial force sensors have been implemented exploiting other technologies, such as metallic load cells and ceramic load cells. However, multi-axial force sensors based on metallic load cells have issues related to low sensitivity, high cost, big size (especially for high-load applications) and high energy requirements (caused by the use of metallic strain gauges). Multi-axial force sensors based on ceramic load cells have other drawbacks, related to the technology of making resistors; screen printing for thick film resistors is the technology being used with limitations in miniaturization and flexibility in design. To make a multi-axial ceramic force sensor it is necessary to make use of complex mechanical features within the sensor layout. For this reason, multi-axial force sensors based on ceramic load cells need a complex package, increasing their cost. Moreover, force sensors based on ceramic load cells like the metallic ones have typically low resolution for high full scale ranges.

BRIEF SUMMARY

The present disclosure provides a microelectromechanical transducer, a method of manufacturing the microelectromechanical transducer, and a method for operating the microelectromechanical transducer to overcome at least some of the problems previously discussed. In particular, embodiments of the present disclosure provide a semiconductor microelectromechanical transducer based on piezoresistive transduction, configured to work both as a uni-axial force sensor or a multi-axial force sensor.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIG. 10 is a more detailed perspective exploded view showing the multiple layers of the multi-layered multi-axial sensor of FIG. 9 according to an embodiment of the present disclosure;

FIG. 11 is a top view of the multi-axial sensor of FIG. 10 looking through the cap layer and showing the piezoresistive groups in the sensor body layer; and FIG. 12 is a perspective view of the multi-axial sensor of FIGS. 10 and 11 showing the cap layer, sensor body layer and substrate layer positioned on top of one another in the assembled multi-axial sensor.

DETAILED DESCRIPTION

Figure 1A:
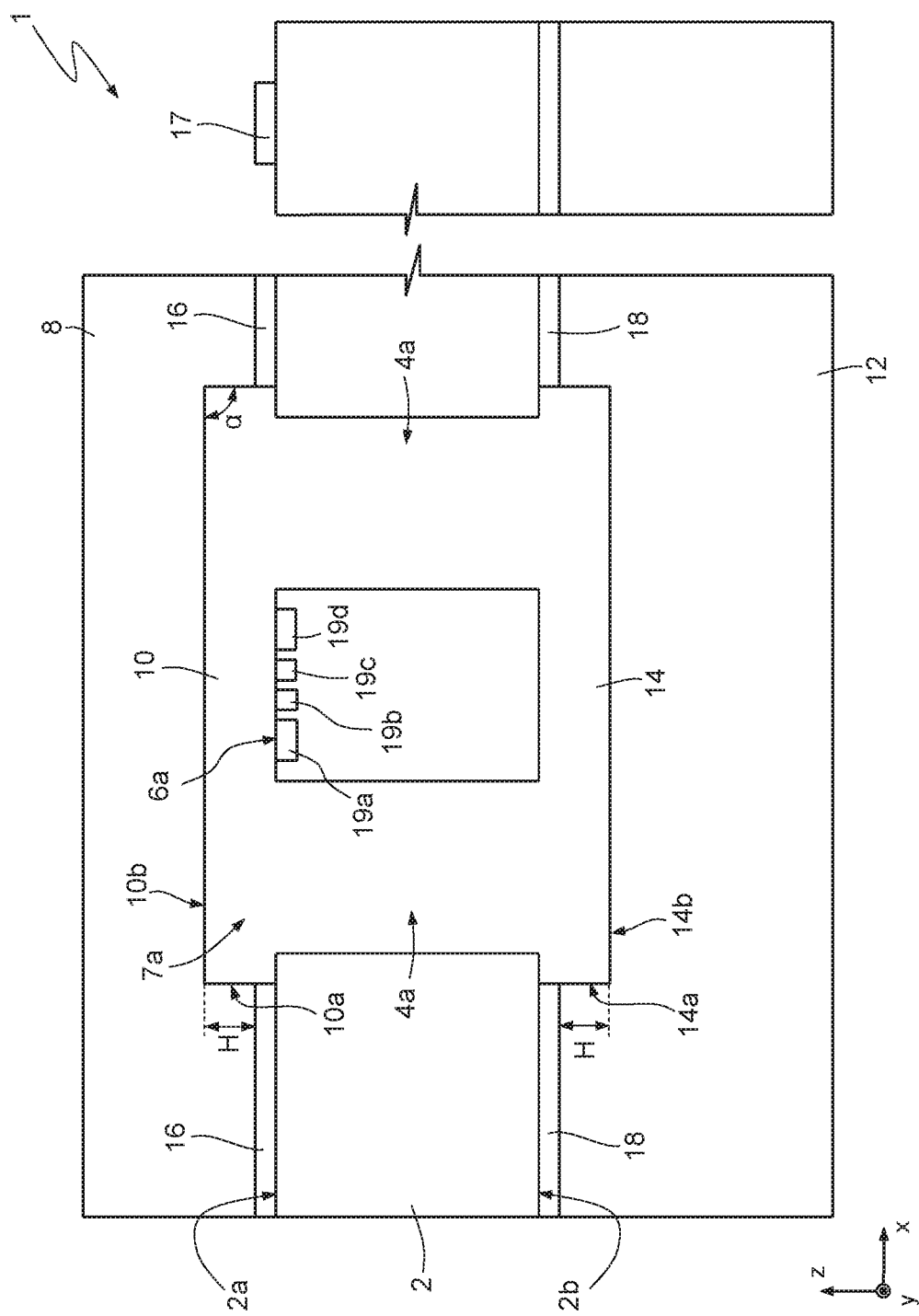
FIG. 1A is a first cross-sectional view of a microelectromechanical transducer of FIG. 2 according to an embodiment of the present disclosure.
Figure 1B:
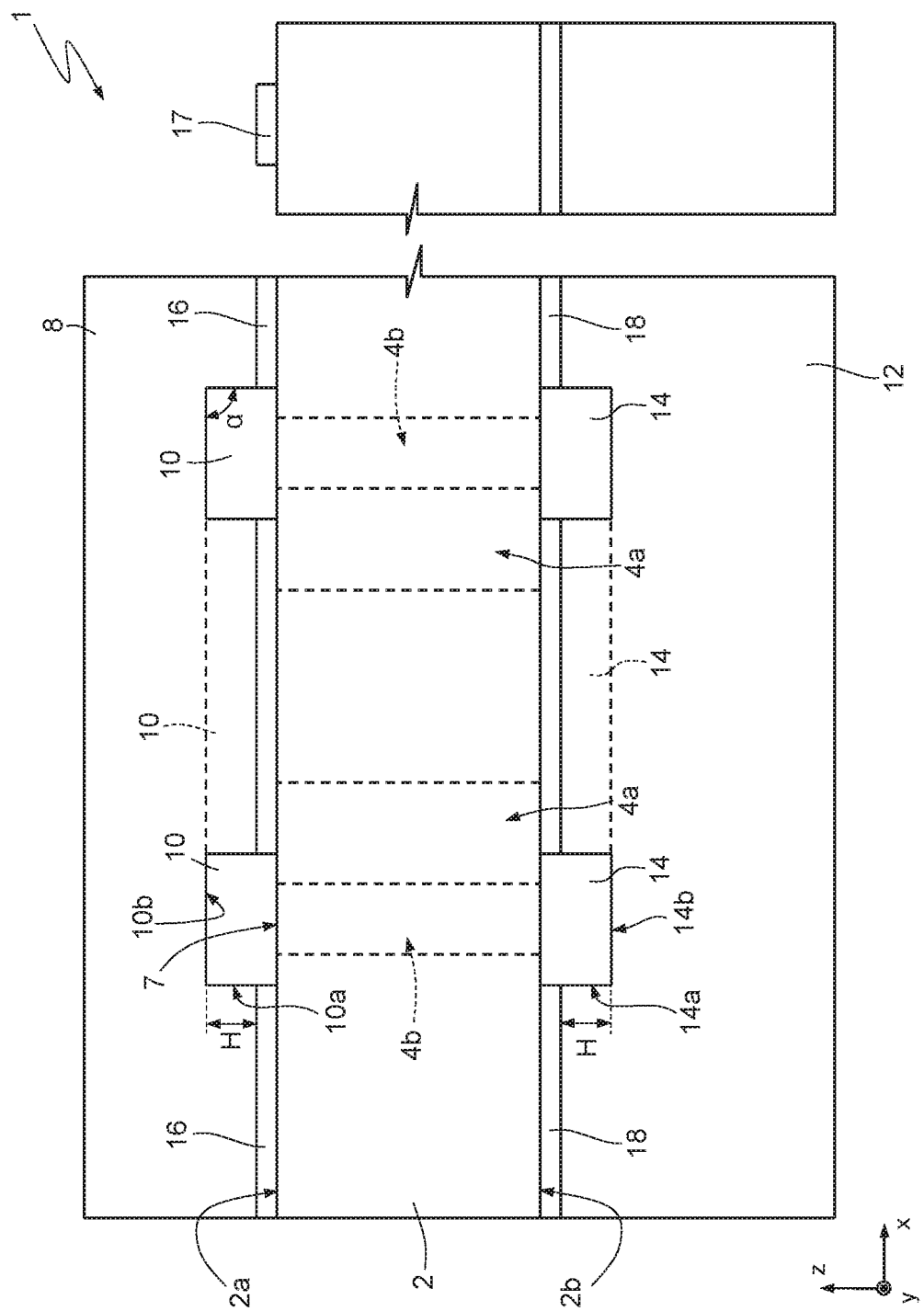
FIG. 1B is a second cross-sectional view of the microelectromechanical transducer of FIG. 2.
Figure 2:
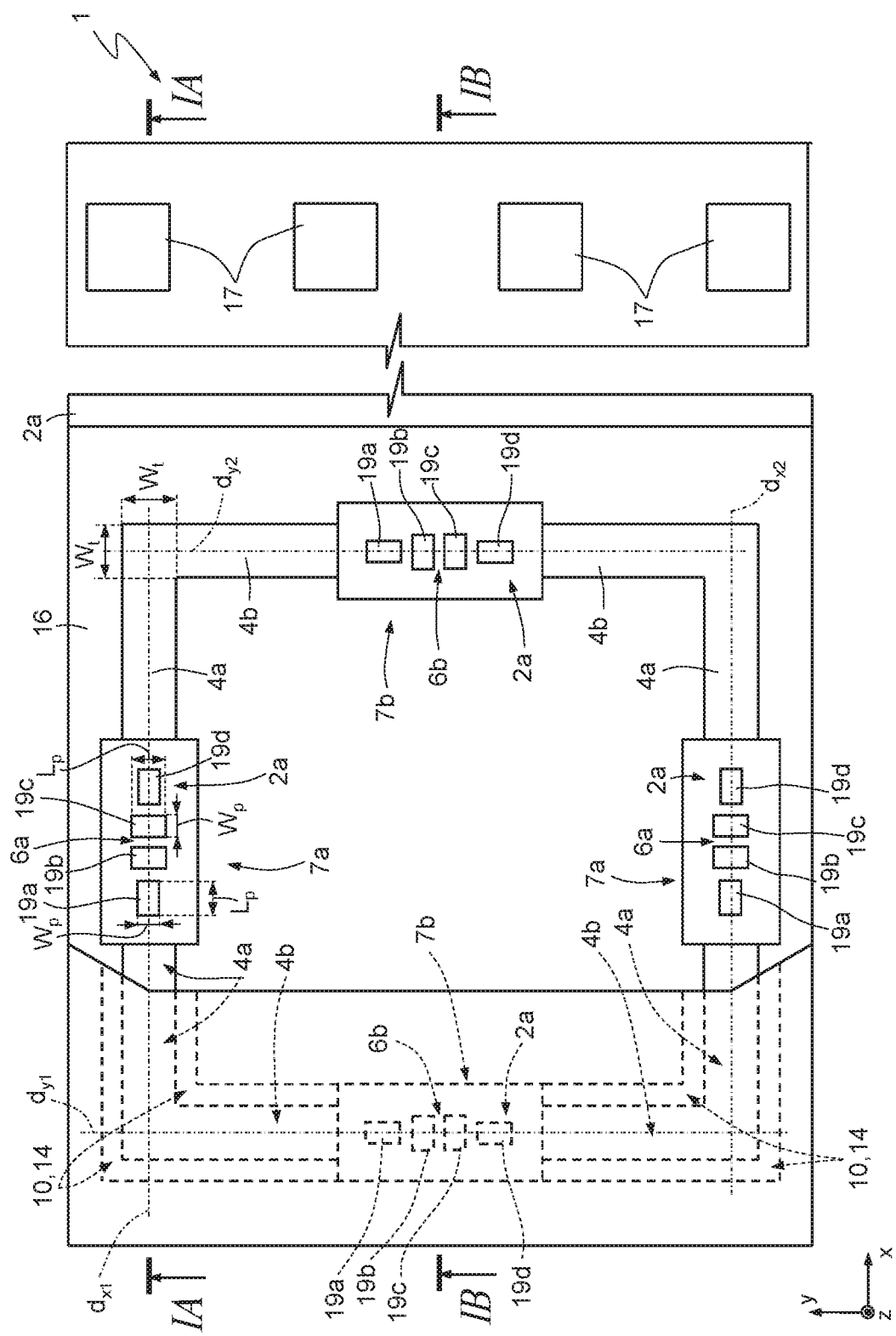
FIG. 2 is a top view of the microelectromechanical transducer of FIG. 1A and FIG. 1B.

FIGS. 1A, 1B show respective cross-sectional views of a microelectromechanical transducer, in particular a multi-axial force sensor, 1 according to an embodiment of the present disclosure. FIG. 2 shows a top view of the multi-axial force sensor 1 of FIGS. 1A, 1B in an xy-plane. FIG. 1A shows a cross-sectional view of the multi-axial force sensor 1 at the cross-section labeled IA in FIG. 2 while FIG. 1B shows a cross-sectional view of the multi-axial force sensor at the cross-section labelled IB in FIG. 2. The multi-axial force sensor 1 in FIGS. 1A, 1B and 2 is represented in a system of spatial coordinates defined by three axes x, y, z, orthogonal to one another. The cross-sectional view of FIG. 1A is taken along the line I-I shown in FIG. 2, while the cross-sectional view of FIG. 1B is taken along the line II-II shown in FIG. 2.

Referring to FIGS. 1A, 1B and 2, the multi-axial force sensor 1 comprises a sensor body 2 having a front surface 2a and rear surface 2b, extending in parallel with the plane xy. A plurality of trenches 4 extends throughout the sensor body 2 from the front surface 2a to the rear surface 2b, in particular parallel to the z axis.

According to one aspect of the present disclosure, the plurality of trenches 4 includes first trenches 4a and second trenches 4b. The first trenches 4a have a main direction of extension, parallel to the plane xy, parallel to a first direction. The second trenches 4b have a main direction of extension, parallel to the plane xy, parallel to a second direction, different from the first direction. In particular, in the multi-axial force sensor 1 of FIGS. 1A, 1B and 2 the main direction of extension, on the plane xy, of the first trenches 4a is the x axis, while the main direction of extension on the plane xy of the second trenches 4b is the y axis. Therefore, according to the embodiment of FIGS. 1A, 1B and 2, the first direction of the first trenches 4a is orthogonal to the second direction of the second trenches 4b.

As shown in FIG. 2, a plurality of piezoresistive groups 6a-6b is arranged at the front surface 2a of the substrate or body 2. In particular, each first piezoresistive group 6a is arranged between a respective pair of first trenches 4a, whereas each second piezoresistive group 6b is arranged between a respective pair of second trenches 4b. Each of the first piezoresistive groups 6a and the second piezoresistive groups 6b include piezoresistive elements 19a-19d. Therefore, the piezoresistive elements 19a-19d of each piezoresistive group 6a are arranged one next to the other along a respective direction parallel to the x axis, at a distance from each other and from the trenches 4a, whereas the piezoresistive elements 19a-19d of each piezoresistive group 6b are arranged one next to the other along a respective direction parallel to the y axis, at a distance from each other and from the trenches 4b. The trenches 4 and the piezoresistive groups 6a-6b define an active region 7 of the multi-axial force sensor 1.

According to one aspect of the present disclosure, the sensor body 2 is of a semiconductor material and in particular silicon. More specifically, the sensor body 2 is made of n-type single-crystal (100) silicon and the piezoresistors 6 are p+ implanted regions.

With reference to FIGS. 1A, 1B, 2, a first structural body 8 having the function of a cap is coupled to the front surface 2a of the sensor body 2 through a first coupling region 16. For clarity of representation only, the first structural body 8 is only partially shown in FIG. 2, covering only one piezoresistive group 6b, and exposing the other piezoresistive groups 6a-6b. In the following, the first structural body 8 is referenced as "cap." The cap 8 has a recess 10 facing the front surface 2a in correspondence of the active region 7. The recess 10 is delimited by lateral walls 10a of height H, and a bottom wall 10b. Exemplary values of the height H of the lateral walls 10a are in the range of 1-500 μm. The lateral walls 10a and the bottom wall 10b are adjacent to one another, forming an angle α. According to an aspect of the present disclosure, to improve the mechanical coupling between the cap 8 to the sensor body 2, the angle α is greater than or equal to 90°. In further embodiments, the angle α may be lower than 90°.

The lateral walls 10a surround the active region 7 and the bottom wall 10b extends at a distance from the front surface 2a of the sensor body 2. In this way, the recess 10 of the cap 8 defines a sealed cavity, wherein the active region 7 is housed. The cavity is sealed by means of the first coupling region 16, made for instance of glass, metal bonding like Al/Ge or Au/Ge alloys, bi-adhesive layers, in general wafer bonding materials. The first coupling region 16 may be formed by wafer-to-wafer bonding techniques (e.g., glass frit bonding). A plurality of pads 17 are arranged on a region of the sensor body 2 not covered by the cap 8, to allow electrical access to the multi-axial force sensor 1, for instance by wire bonding. The pads 17 form electrical contact terminals for the piezoresistive groups 19a-19d connected in the Wheatstone bridge configuration. The pads are connected to the piezoresistive groups 19a-19d by conductive paths passing through the cap 8 and/or the sensor body 2. The pads 17 may be of any suitable material, for instance Aluminum.

A second structural body 12 having the function of a supporting element or substrate is coupled to the rear surface 2b of the sensor body 2 through a second coupling region 18. In the following, the second structural body 12 is referenced as "substrate." The substrate 12 has a recess 14 facing the rear surface 2b in correspondence of the area in which the trenches 7 extend. The recess 14 is delimited by lateral walls 14a and a bottom wall 14b. The lateral walls 14a surround the trenches 4 and the bottom wall extends at a distance from the rear surface 2b of the sensor body 2. In this way, the recess 14 of the substrate 12 defines a sealed cavity. In particular, according to one aspect of this embodiment, the recesses 14 and 10 are at least partially aligned along the z-axis. In particular, the recesses 14 and 10 are overlapping, as it can be seen from a top view on the xy-plane.

The recess 14 is sealed by means of the second coupling region 18, made for instance of glass, metal bonding materials like Al/Ge alloys or bi-adhesive layers. Analogously to the first coupling region 16, the second coupling region 18 may be formed by wafer-to-wafer bonding techniques (e.g., glass frit bonding).

The cap 8 and the substrate 12 may be of any suitable material, such as semiconductor materials, ceramics, steel or metallic alloys (e.g., Invar, or FeNiCo alloys).

With reference to FIG. 2, a first sensing unit 7a includes a first piezoresistive group 6a and the respective pair of first trenches 4a between which the first piezoresistive group 6a is arranged, and a second sensing unit 7b includes a second piezoresistive group 6b and the respective pair of second trenches 4b between which the second piezoresistive group 6b is arranged.

Two first sensing units 7a extend at a distance from one another with a respective main direction dx1, dx2 of extension parallel to the x axis. Two second sensing units 7b extend at a distance from one another with a respective main direction dy1, dy2 of extension parallel to the y axis.

According to an embodiment of the present disclosure, each first trench 4a is seamlessly connected to one respective second trench 4b; more in particular, first trenches 4a and second trenches 4b are connected at one of their ends, forming a right angle, and extend continuously from a first piezoresistive group 6a to a second piezoresistive group 6b.

According to other embodiments of the present disclosure, first trenches 4a of first sensing units 7a are not connected to second trenches 4b of second sensing units 7b.

From a top view on the xy-plane shown in FIG. 2, the trenches 4 have a substantially rectangular shape, for instance with rounded corners. Longer sides of the rectangles define the length of the trenches 4, whereas the shorter sides define the width $W_t$ of the trenches 4.

Each piezoresistive element 19a-19d of the piezoresistive groups 6a-6b has a substantially rectangular or oval or elliptical shape, with a major axis defining a length $L_p$ of the piezoresistive element 19a-19d and a minor axis defining a width $W_p$ of the piezoresistive element 19a-19d. Exemplary values of the dimensions of the piezoresistive elements 19a-19d are in the range of 5-100 μm for the length $L_p$, for instance $L_p$=30 μm, and in the range of 1-50 μm for the width $W_p$, for instance $W_p$=10 μm.

Exemplary values of the dimensions of the trenches 4 are in the range of 10-1000 μm for the length, and in the range of 5-500 μm for the width $W_t$, provided that the width $W_t$ of the trench is higher than the length $L_p$ of the piezoresistive elements 19a-19d.

Figures 3, 4:
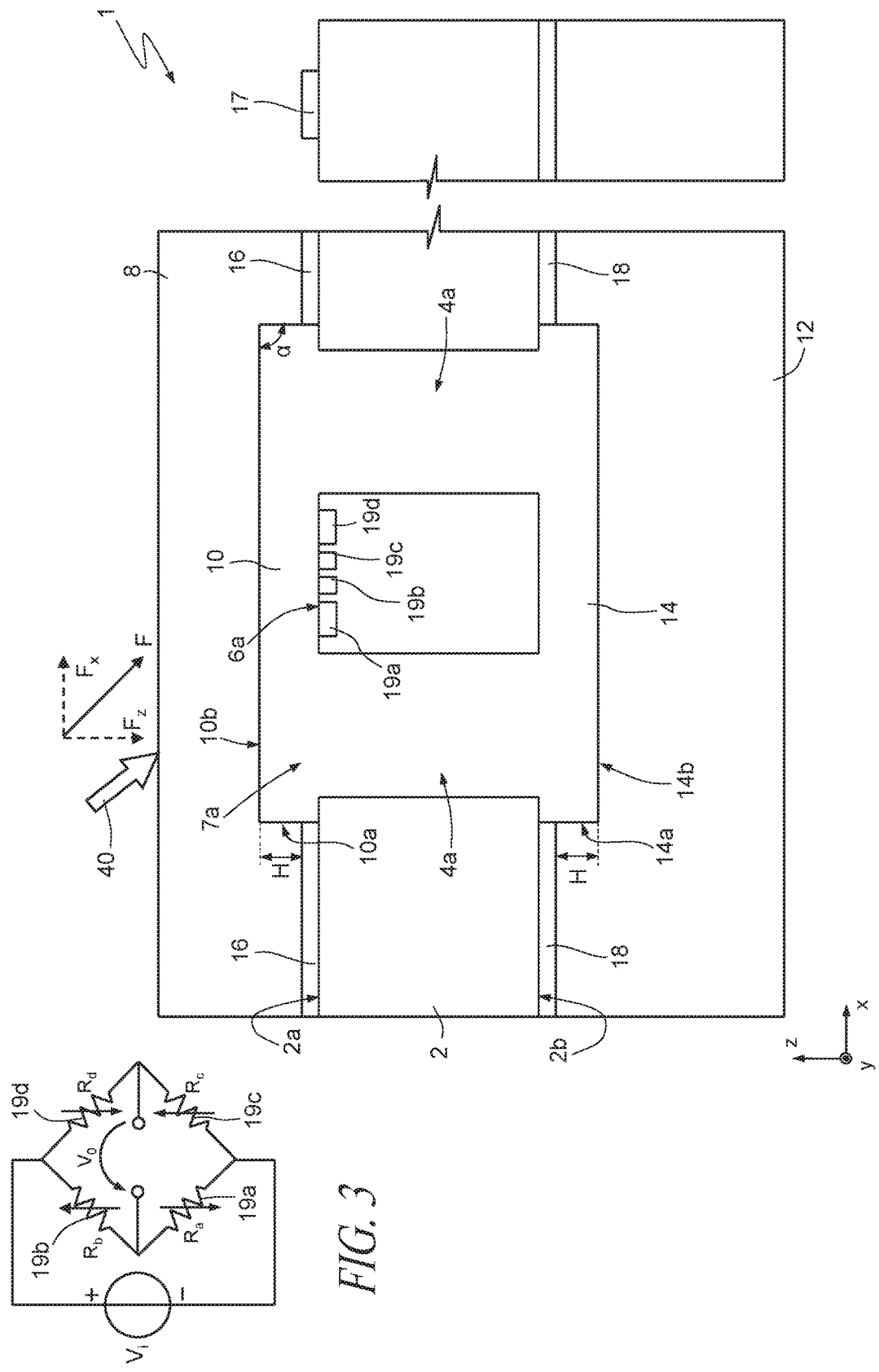
FIG. 3 is a circuit representation of a Wheatstone bridge employed as read-out circuit of the microelectromechanical transducer of FIG. 1A, FIG. 1B and FIG. 2.
FIG. 4 is a cross-sectional view of the microelectromechanical transducer of FIG. 1A during use as a force sensor.

In each sensing units 7a-7b, piezoresistive elements 19a-19d may be arranged in such a way that their length $L_p$ is parallel or perpendicular to the length $L_t$ of the trenches 4a, 4b of the respective sensing unit 7a-7b. In this embodiment, each piezoresistive group 6a-6b includes four piezoresistive elements 19a-19d, which are electrically connected in a Wheatstone bridge configuration, as schematically shown in FIG. 3. To achieve a proper functioning of the Wheatstone bridge (as detailed in the following), two piezoresistive elements 19a, 19d, are arranged in such a way that their length $L_p$ is parallel to the length $L_t$ of the trenches 4a (4b) of the respective sensing unit 7a (7b), whereas the other two piezoresistors 6b, 6c, are arranged in such a way that their length $L_p$ is perpendicular to the length $L_t$ of the trenches 4a (4b) of the respective sensing unit 7a (7b).

FIG. 4 illustrates the multi-axial force sensor 1 in a working condition. More in particular, FIG. 4 shows the multi-axial force sensor 1, in the cross-sectional view of FIG. 1A, when subject to a multi-axial force F represented by an arrow 40. The force F can be expressed in terms of its components Fx, Fy, Fz, respectively along the x, y, z axes. Due to the fact that the cap 8 is anchored to the sensor body 2 through the first coupling region 16, the relative expansion of the cap 8 on the sensor body 2 caused by the applied force induces a shear load and thus a planar stress distribution at the surface 2a of the sensor body 2, and therefore on the piezoresistive units 19a-19d.

In this example, the multi-axial force F presents non-zero components along all axes x, y, z, therefore it can be considered a superposition of normal forces and out of plane forces (with respect to the surface 2a).

The force components Fx, Fy, Fz of the multi-axial force F induce a planar mechanical stress σ at the surface 2a of the sensor body 2. The arrangement of the trenches 4 affects the value of the components of the planar stress σ in the regions where the piezoresistive groups 6a-6b are located. In particular, for each sensing unit 7a-7b, the respective trenches 4a-4b limit the effect of the force components parallel to the respective main direction of extension dx1, dx2, dy1, dy2.

In particular, force component Fx induces a planar stress σ which is maximized in the regions where the piezoresistive groups 6b are located, whereas force component Fy induces a planar stress σ which is maximized in the regions where the piezoresistive groups 6a are located. The force component Fz induces an equal planar stress distribution on all the piezoresistive groups 6a-6b.

When subject to the planar stress σ, the i-th piezoresistive unit 19a . . . 19d changes its resistance value $R_i$ according to the known equation (1) of piezo-resistivity effect of silicon:

$$\frac{\Delta R_i}{R_i} = \frac{\Delta \rho_i}{\rho_i} = \pi_l \sigma_{li} + \pi_t \sigma_{ti} + \pi_z \sigma_{zi} \quad (1)$$

where $\rho_i$ is the resistivity of the i-th piezoresistive unit 19a; . . . ; 19d; $\pi_l$, $\pi_t$ and $\pi_z$ are respectively the longitudinal (parallel to the length $L_p$), transversal (parallel to the width $W_p$) and normal (parallel to z axis) components of the piezoresistive coefficient matrix of the region of the sensor body 2 where the piezoresistive units 19a-19d are located; $\sigma_{li}$, $\sigma_{ti}$ and $\sigma_{zi}$ are respectively the longitudinal, transversal and normal components of the stress with respect to the i-th piezoresistive units 19a-19d. More in particular, since the piezoresistive units 19a-19d are exclusively subject to a planar stress σ at the surface 2a of the sensor body 2, the normal component $\sigma_{zi}$ becomes zero. As an example, in the case of p-type silicon on crystalline plane (001) and crystalline direction <110>, equation (1) is simplified as:

$$\frac{\Delta R_i}{R_i} = \frac{\Delta \rho_i}{\rho_i} = \pi_{in\text{-}plane}(\sigma_{li} - \sigma_{ti}) \quad (2)$$

where $\pi_{in\_plane}$ is about one half of the silicon piezoresistive coefficient $\pi_{44}$ ($\pi_{in\_plane} \approx 70 \times 10^{-11}$ Pa$^{-1}$).

In the first sensing units 7a, first piezoresistive groups 6a are arranged between a pair of first trenches 4a along a direction dx1, dx2, parallel to the x axis. Thus, the effect of force component Fx on the planar stress σ is reduced (due to the first trenches 4a), and the effect of forces Fy is increased. Therefore, the piezoresistive units 19a-19d of the first sensing units 7a are subject to a planar stress σ with main component parallel to the y axis. Since the piezoresistive units 19b and 19c of the first sensing units 7a have a main direction of extension parallel to the y axis, $\sigma_{li}$ is much higher in module than $\sigma_{ti}$. To the contrary, since the piezoresistive units 19a and 19d of the first sensing units 7a have a main direction of extension parallel to the x axis, $\sigma_{ti}$ is much higher in module than $\sigma_{li}$.

For instance, if the force component Fy has positive sign in the considered reference system, the piezoresistive group 6a arranged along the dx1 direction is subject to a compressive stress acting along the y axis, while the piezoresistive group 6a arranged along the dx2 direction is subject to a tensile stress. Considering that compressive stress has a negative sign, within the meaning of equation (1), there is an increase of the resistance values $R_a$, $R_d$ of the piezoresistive units 19a, 19d of the piezoresistive group 6a arranged along the dx1 direction, while there is a decrease of the resistance values $R_b$, $R_c$ of the piezoresistive units 19b, 19c of the piezoresistive group 6a. Instead, considering that tensile stress has a positive sign, within the meaning of equation (1), there is a decrease of the resistance values $R_a$, $R_d$ of the piezoresistive units 19a, 19d of the piezoresistive group 6a arranged along the dx2 direction, while there is an increase of the resistance values $R_b$, $R_c$ of the piezoresistive units 19b, 19c of the piezoresistive group 6a.

If instead the force component Fy has negative sign, the piezoresistive group 6a arranged along the dx1 direction is subject to a tensile stress acting along the y axis, while the piezoresistive group 6a arranged along the dx2 direction is subject to a compressive stress. Considering that compressive stress has a negative sign, there is an increase of the resistance values $R_a$, $R_d$ of the piezoresistive units 19a, 19d of the piezoresistive group 6a arranged along the dx2 direction, while there is a decrease of the resistance values $R_b$, $R_c$ of the piezoresistive units 19b, 19c of the piezoresistive group 6a. Instead, considering that tensile stress has a positive sign, there is a decrease of the resistance values $R_a$, $R_d$ of the piezoresistive units 19a, 19d of the piezoresistive group 6a arranged along the dx1 direction, while there is an increase of the resistance values $R_b$, $R_c$ of the piezoresistive units 19b, 19c of the piezoresistive group 6a.

In any case, the force component Fy has negligible effect on the resistance values of the piezoresistive units 19a-19d of the second piezoresistive groups 6b. This is mainly due to two reasons. From a mechanical point of view, the low sensitivity of the second piezoresistive groups 6b is due to the presence of the trenches 4b and the fact that the two edges of the cap 8 in contact with the sensing units 7b are parallel to the orientation of the sensing units 7b, which is also parallel to the direction of the force component Fy.

Similar considerations are valid, mutatis mutandis, for the effects of force component Fx on the resistance values of the piezoresistive units 19a-19d.

Changes of resistance values in the piezoresistive units 19a-19d connected in a Wheatstone bridge result in a change of the output voltage $V_o$ of the Wheatstone bridge biased by the input voltage $V_i$ as shown in FIG. 3, according to the known equation (2):

$$\frac{V_o}{V_i} = \frac{2\Delta R_{a,d} - 2\Delta R_{b,c}}{4R + 2(2\Delta R_{a,d} + 2\Delta R_{b,c})} = \frac{\Delta R_{a,d} - \Delta R_{b,c}}{2R + 2(\Delta R_{a,d} + \Delta R_{b,c})} \quad (2)$$

In presence of the following condition:

$$\Delta R_a = \Delta R_d = -\Delta R_b = -\Delta R_c = \Delta R$$

$$R_a = R_b = R_c = R_d = R \quad (3)$$

equation (2) is simplified to:

$$\frac{V_o}{V_i} = \Delta R/R \quad (4)$$

Therefore, the output voltage Vo of the first sensing units 7a is correlated to the force component Fy parallel to the y axis, while the output voltage Vo of the second sensing units 7b is correlated to the force component Fx parallel to the x axis.

Force component Fz induces an equal compressive stress distribution on all the piezoresistive groups 6a-6b, and therefore an equal effect on the piezoresistive units 19a-19d. In general, the sign of each Wheatstone bridge output does not only depend on the type of induced stress over the corresponding zone, but it depends also on the configuration of electrical connections between the piezoresistive units 19a-19d.

Moreover, the fact that the force component Fy has negligible effect on the resistance values of the piezoresistive units 19a-19d of the second piezoresistive groups 6b is also due to the fact that the piezoresistive units 19a-19d of the second piezoresistive groups 6b are positioned symmetrically with respect to a line parallel to the x-axis and passing by the centroid of the active region 7. As a consequence, the corresponding Wheatstone bridge is insensitive with respect to loads that induce either the same stress contribution over both piezoresistive groups 6b or an opposite stress contribution for the piezoresistive units 19a and 19b in comparison to the piezoresistive units 19c and 19d.

In conclusion, the force components Fx, Fy, Fz, of the multi-axial force F can be obtained from the output voltages of the sensing units 7a-7b using the following equations:

$$F_x = \frac{S_x}{2 \cdot V_{in}}(-V_1 + V_3)$$

$$F_z = \frac{S_z}{4 \cdot V_i}(V_1 + V_2 + V_3 + V_4),$$

where V1, V2, V3 and V4 are respectively the output $$F_y = \frac{S_y}{2 \cdot V_i}(-V_2 + V_4)$$

voltages of the Wheatstone bridge of the sensing unit 7b along the direction dy2, the sensing unit 7a along the direction dx1, the sensing unit 7b along the direction dy1 and the sensing unit 7a along the direction dx2; and Sx, Sy, Sz are the sensitivities of the multi-axial force sensor 1 respectively along the x, y, z axes, which can be obtained by standard calibration protocols. Moreover, standard optimization procedures for the calculation of the force components may be adopted to take into account non-idealities of the sensing units.

An exemplary method for manufacturing the multi-axial force sensor of FIGS. 1A, 1B and 2 is now described.

First, an n-type single-crystal (100) silicon wafer comprising the sensor body 2 is provided. A first photoresist mask is formed on top of the front surface 2a, by standard optical lithography techniques. Openings in the photoresist mask correspond to the regions where the piezoresistive units 19a-19d should be formed. The piezoresistive units 19a-19d may be formed by implantation or diffusion of p-type dopant elements, for instance boron. The techniques to form the piezoresistive units 19a-19d, as well as their connection in a Wheatstone bridge, are known and thus they will not be described in further detail. After removing the first photoresist mask, a second photoresist mask is formed on top of the front surface 2a. The openings in the second photoresist mask correspond to the areas in which the trenches 4 should be formed, at a distance from the areas in which the piezoresistive units 19a-19d were formed. Using the second photoresist mask, the sensor body 2 is etched selectively through its whole thickness, until openings at the rear surface 2b are formed. The etching step to form the trenches 4 is a standard bulk micromachining technique and it may be of a wet or dry type. The second photoresist mask is then removed.

A second wafer of silicon or any other suitable material is provided, comprising the cap 8. A third photoresist mask is formed on the front side of the second wafer by standard optical lithography techniques. The openings on the third photoresist mask correspond to the position of the recess 10. The area of the openings on the third photoresist mask should be defined in such a way that it includes the area of the openings of both the first and the second photoresist mask when they are aligned to one another. Using the third photoresist mask, the cap 8 is etched selectively up to a depth lower than its thickness. Then, the third photoresist mask is removed.

A third wafer of silicon or any other suitable material is provided, comprising the substrate 12. A fourth photoresist mask is formed on the front side of the third wafer by standard optical lithography techniques. The openings on the fourth photoresist mask correspond to the position of the cavity 14. The area of the openings on the fourth photoresist mask should be defined in such a way that it includes the area of the openings of both the first and the second photoresist mask when they are aligned to one another. Using the fourth photoresist mask, the substrate 12 is etched selectively up to a depth lower than its thickness. Then, the fourth photoresist mask is removed.

Next, the first wafer, comprising the sensor body 2, and the second wafer, comprising the cap 8, are coupled to one another at the surface 2a through the coupling region 16, obtained by known wafer-to-wafer bonding techniques, for instance glass frit.

Next, the first wafer, comprising the sensor body 2, and the third wafer, comprising the substrate 12, are coupled to one another at the surface 2b through the coupling region 18, obtained by known wafer-to-wafer bonding techniques, for instance glass frit.

In this way, the active region 7 is not exposed to the environment.

Figure 5:
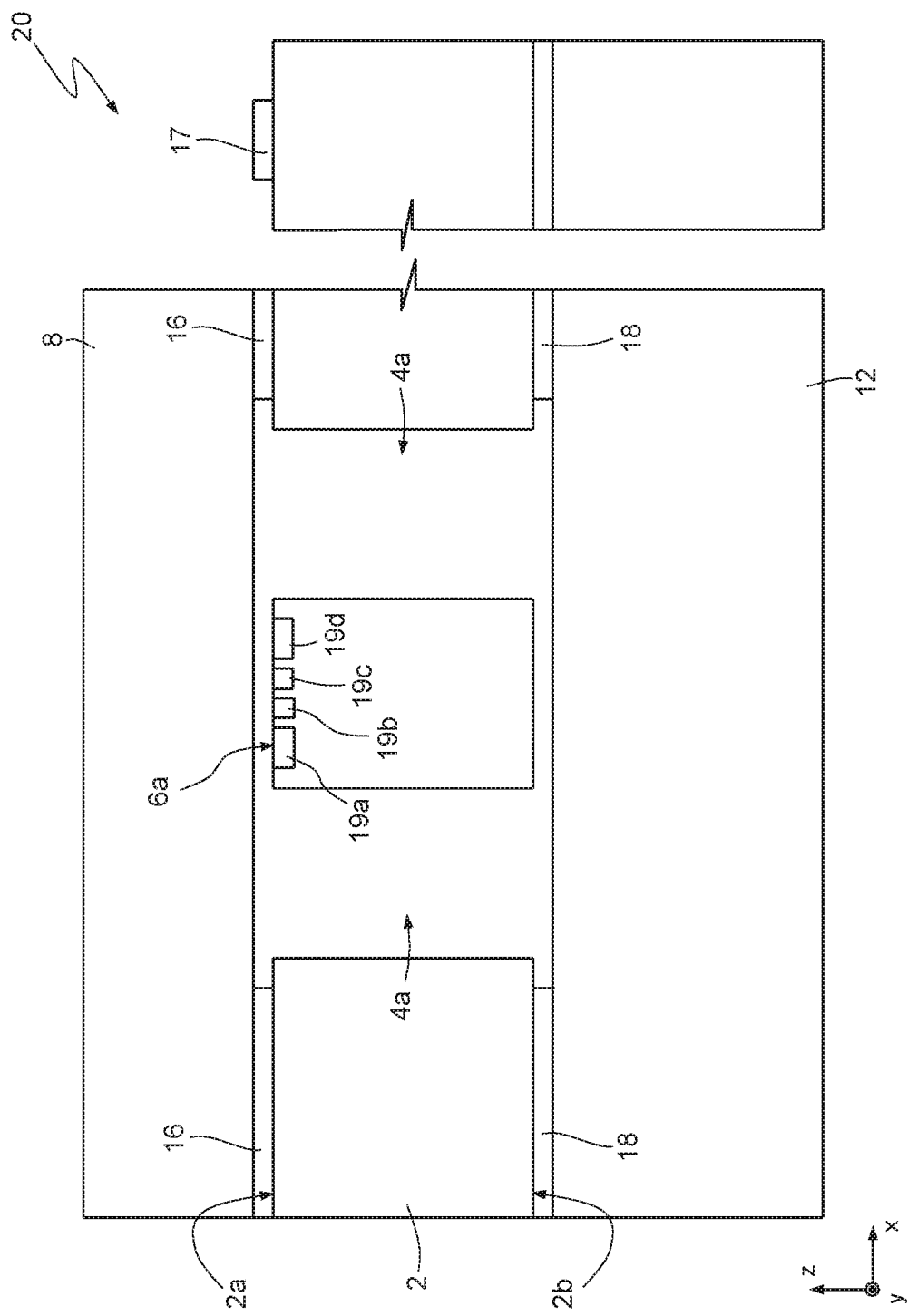
FIG. 5 is a cross-sectional view of a microelectromechanical transducer according to another embodiment of the present disclosure.

FIG. 5 shows a multi-axial force sensor 20 according to a further embodiment of the present disclosure. Differently from the multi-axial force sensor 1 illustrated in FIGS. 1A, 1B, 2, the recesses 10 and 14 are not present. All other elements are in common to the multi-axial force sensor 1 of FIGS. 1A, 1B, 2, and designated by the same reference numbers, thus they are not described any further. As in the case of the multi-axial force sensor 1 of FIGS. 1A, 1B, 2, the cap 8 and the substrate 12 are at a distance from the front surface 2a and rear surface 2b, respectively, by means of the coupling regions 16 and 18. The multi-axial force sensor 20 of FIG. 5 is easier to be manufactured than the multi-axial force sensor 1 of FIGS. 1A, 1B, 2, because it does not include the etching steps of the cap 8 and the substrate 12 to form the recesses 10 and 14.

During use of the multi-axial force sensors 1, 20, a pressure or force applied along the z-axis may cause the cap 8 and the substrate 12 to bend towards the sensor body 2 in correspondence of their respective free surfaces facing the sensor body 2. To ensure protection and a proper functioning of the active region 7, neither the cap 8 nor the substrate 12 should come into direct contact, while bending, with the piezoresistive groups 6a-6b. The multi-axial force sensor 20 can withstand lower forces applied to the z axis with respect to the multi-axial force sensor 1 of FIGS. 1A, 1B, 2 since the stress concentration in the region where the cap 8 and the substrate 12 come in contact with the sensor body 2 is higher compared to the multi-axial force sensor 1.

Figure 6:
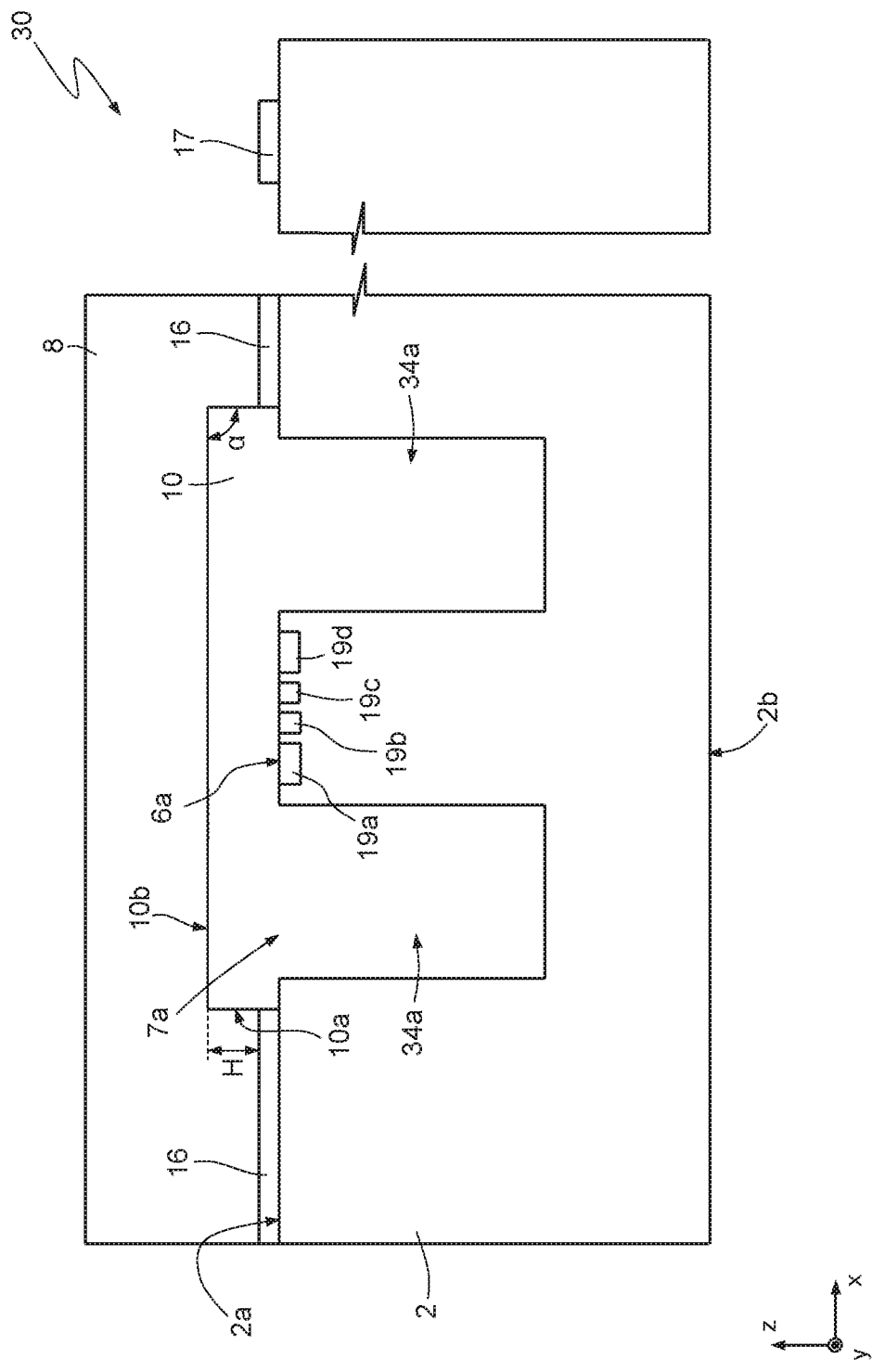
FIG. 6 is a cross-sectional view of a microelectromechanical transducer according to a further embodiment of the present disclosure.

FIG. 6 shows a multi-axial force sensor 30 according to a further embodiment of the present disclosure. Differently from the multi-axial force sensor 1 illustrated in FIGS. 1A, 1B, 2, the substrate 12 is not present. Furthermore, trenches 34, functionally corresponding to the trenches 4 of the multi-axial force sensor 1, extend in the sensor body 2 at a depth lower or less than the thickness of the sensor body 2. In other words, the trenches 34 end within the sensor body 2, at a distance from the rear surface 2b. Exemplary values of the depth of the trenches 34 range from 5 to 100 µm. The trenches 34 of the multi-axial force sensor 30 include first trenches 34a having main direction of extension parallel to the x axis and second trenches 34b having main direction of extension parallel to the y axis, analogously respectively to the first trenches 4a and the second trenches 4b of the multi-axial force sensor 1 of FIGS. 1A, 1B, 2. All other elements are in common to the multi-axial force sensor 1 of FIGS. 1A, 1B, 2 and designated by the same reference numbers, thus they are not described any further.

The multi-axial force sensor 30 has a lower thickness and lower manufacturing cost than the multi-axial force sensors 1 and 20.

According to a further embodiment, not shown in the figures, the recess 10 of the cap 8 of the multi-axial force sensor 30 may not be present, analogously to what described above with reference to FIG. 5.

Figure 7:
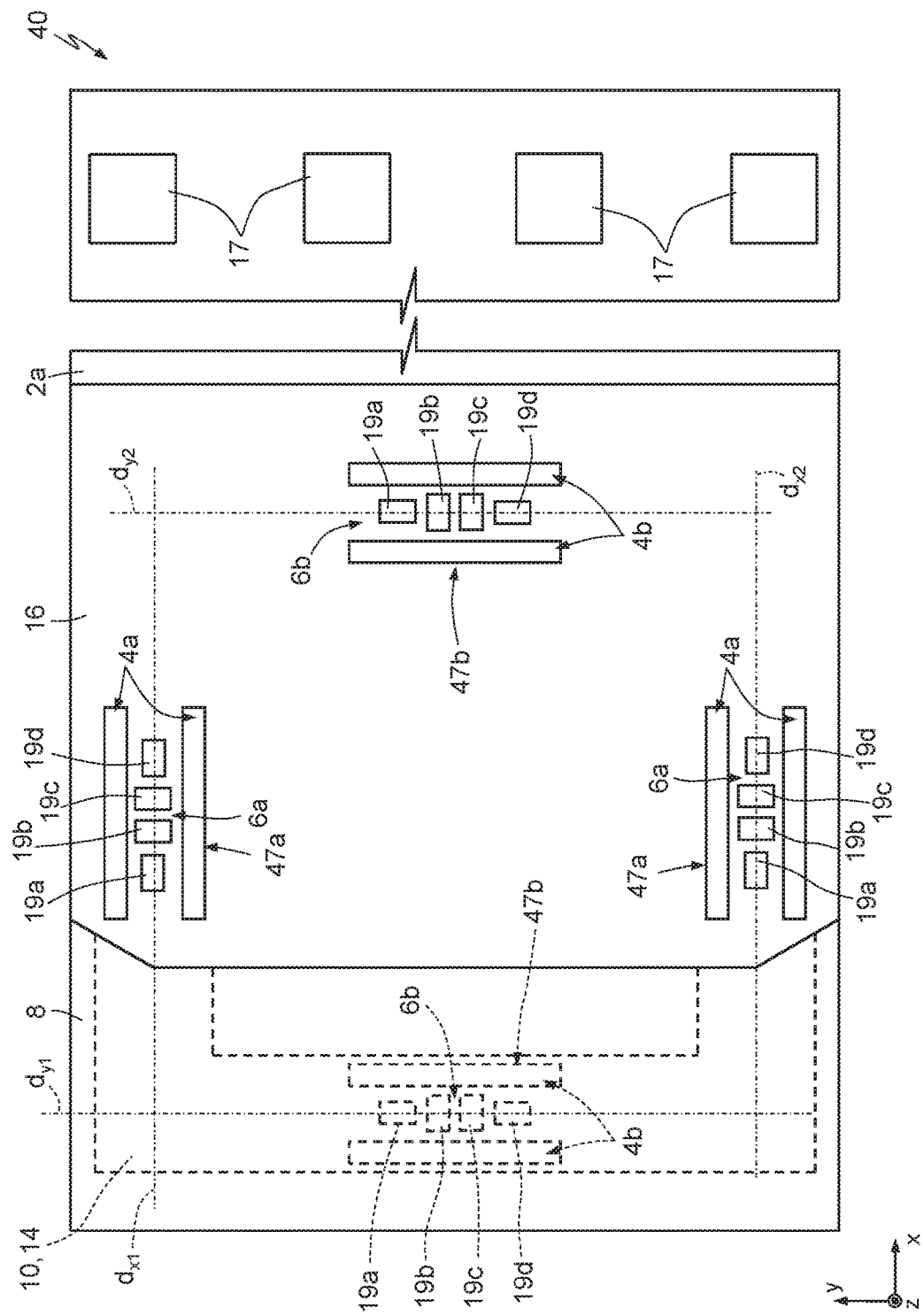
FIG. 7 is a top view of a microelectromechanical transducer according to another embodiment of the present disclosure.

FIG. 7 shows a top view of a multi-axial force sensor 40 according to a further embodiment of the present disclosure. The multi-axial force sensor 40 includes two first sensing units 47a and two second sensing units 47b. Each first sensing unit 47a includes two first trenches 4a and one first piezoresistive group 6a. Each second sensing unit 47b includes two second trenches 4b and one first piezoresistive group 6a.

Each first trench 4a has a main direction of extension parallel to the x axis. In each first sensing unit 47a, a first piezoresistive group 6a extends between respective first trenches 4a, along a direction parallel to the main direction of extension of the first trenches 4a and at a distance from the first trenches 4a. Therefore, for each first sensing unit 47a, the first piezoresistive group 6a extends along a main direction dx1, dx2, parallel to the x axis and two first trenches 4a extend along respective main directions which are parallel to, and distinct from, the main direction dx1 (dx2). The piezoresistive group 6a and the trenches 4a of a same first sensing unit 47a are aligned to one another along the y axis. More in particular, both first sensing units 47a are aligned to one another along the y axis and are symmetric with respect to a line parallel to the x axis and passing by the centroid of the active region 7 (FIG. 1B).

In each second sensing unit 47b, a second piezoresistive group 6b extends between respective second trenches 4b, along a direction parallel to the main extension of the second trenches 4b, and at a distance from the second trenches 4b. Therefore, for each second sensing unit 47b, the second piezoresistive group 6b extends along a main direction dy1, dy2, parallel to the y axis and two second trenches 4b extend along respective directions which are parallel to, and distinct from, the main direction dy1 (dy2). The piezoresistive group 6b and the trenches 4b of a same second sensing unit 47b are aligned to one another along the x axis. More in particular, both second sensing units 47b are aligned to one another along the x axis and are symmetric with respect to a line parallel to the y axis and passing by the centroid of the active region 7 (FIG. 1B).

The first sensing units 47a do not overlap with the second sensing units 47b.

All other elements are in common to the multi-axial force sensor 1 of FIGS. 1A, 1B, 2 and designated by the same reference numbers, thus they are not described any further. The variations described with reference to FIGS. 5 and 6 applies to the embodiment of FIG. 7 as well.

In use, a shear force component Fy parallel to the y axis will induce a tensile planar stress $\sigma_x$ parallel to the x axis on the first piezoresistive groups 6a, while a shear force component Fx parallel to the x axis will induce a tensile planar stress $\sigma_y$ parallel to the y axis on the second piezoresistive groups 6b.

Figure 8:
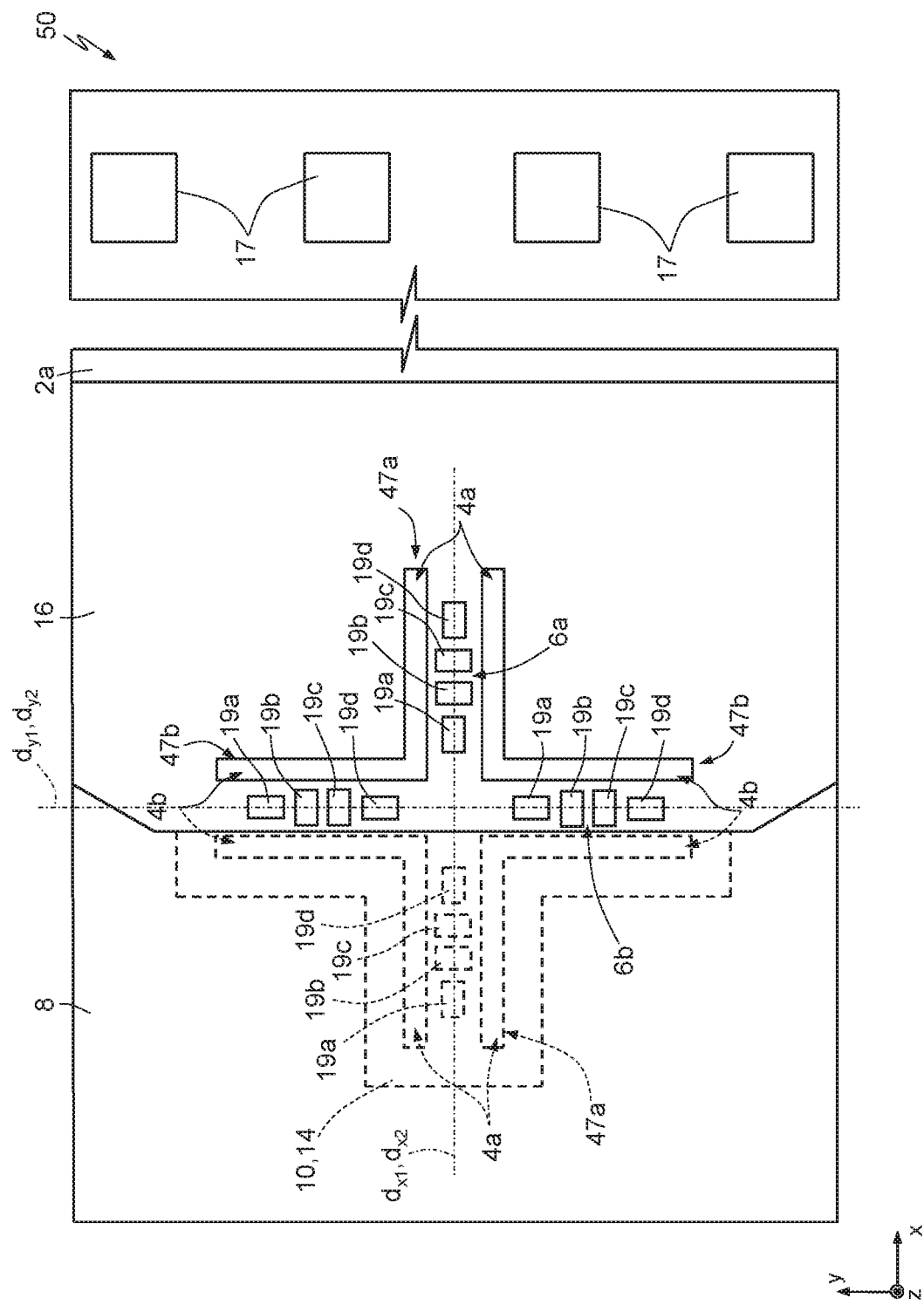
FIG. 8 is a top view of a microelectromechanical transducer according to a further embodiment of the present disclosure.

FIG. 8 shows a top view of a multi-axial force sensor 50 according to a further embodiment of the present disclosure. The multi-axial force sensor 50 includes two first sensing units 47a and two second sensing units 47b, which have elements in common to the multi-axial force sensor 40 of FIG. 7.

In this embodiment, the main directions dx1, dx2 of extension of the first piezoresistive groups 6a are coincident with one another and with the x axis. Analogously, also the main directions dy1, dy2 of extension of the second piezoresistive groups 6b are coincident with one another and with the y axis.

The main directions dx, dy of extension of the sensing units 47a-47b are chosen in a way such that the sensing units 47a-47b are arranged in the shape of a cross; moreover, the main directions dx, dy of extension of the sensing units 47a-47b are chosen in order to seamlessly connect a first trench 4a of a first sensing unit 47a to a respective second trench 4b of a second sensing unit 47b, and the other first trench 4a of the first sensing unit 47a to a respective second trench 4b of the other second sensing unit 47b.

All other elements are in common to the multi-axial force sensor 1 of FIGS. 1A, 1B, 2 and designated by the same reference numbers, thus they are not described any further. The variations described with reference to FIGS. 5 and 6 applies to the embodiment of FIG. 7 as well.

The advantages of embodiments of the disclosure described previously, according to the various embodiments, emerge clearly from the foregoing description.

In particular, the spatial configuration of the trenches 4 and the piezoresistive units 19a-19d allow obtaining a multi-axial force sensor based on silicon technology, able to measure both normal forces and out-of-plane shear forces. Moreover, the spatial configuration of the trenches 4 and the piezoresistive units 19a-19d allows accurate measurements in the case of non-homogenous or partially concentrated loads.

Finally, it is clear that modifications and variations may be made to what has been described and illustrated herein, without thereby departing from the scope of the present disclosure.

For instance, the cap 8, the sensor body 2 and the substrate 12 may be of any suitable size and shape.

Moreover, the piezoresistive groups 6a, 6b may include only one or two piezoresistive elements.

Furthermore, the trenches may have different shapes than the rectangular, or substantially rectangular, shape described above. For instance, the trenches may have a rounded shape, a generic polygonal shape, etc.

Furthermore, the main directions of extension of the first and second trenches may also be non-orthogonal to one another, i.e., the main directions of extension of the first and second trenches intersect to one another forming an angle different from 90 degrees.

Moreover, the size of the cap and of the active region can be enlarged in order to increase the full scale of the multi-axial force sensor, according to the needs of the application.

Figure 9:
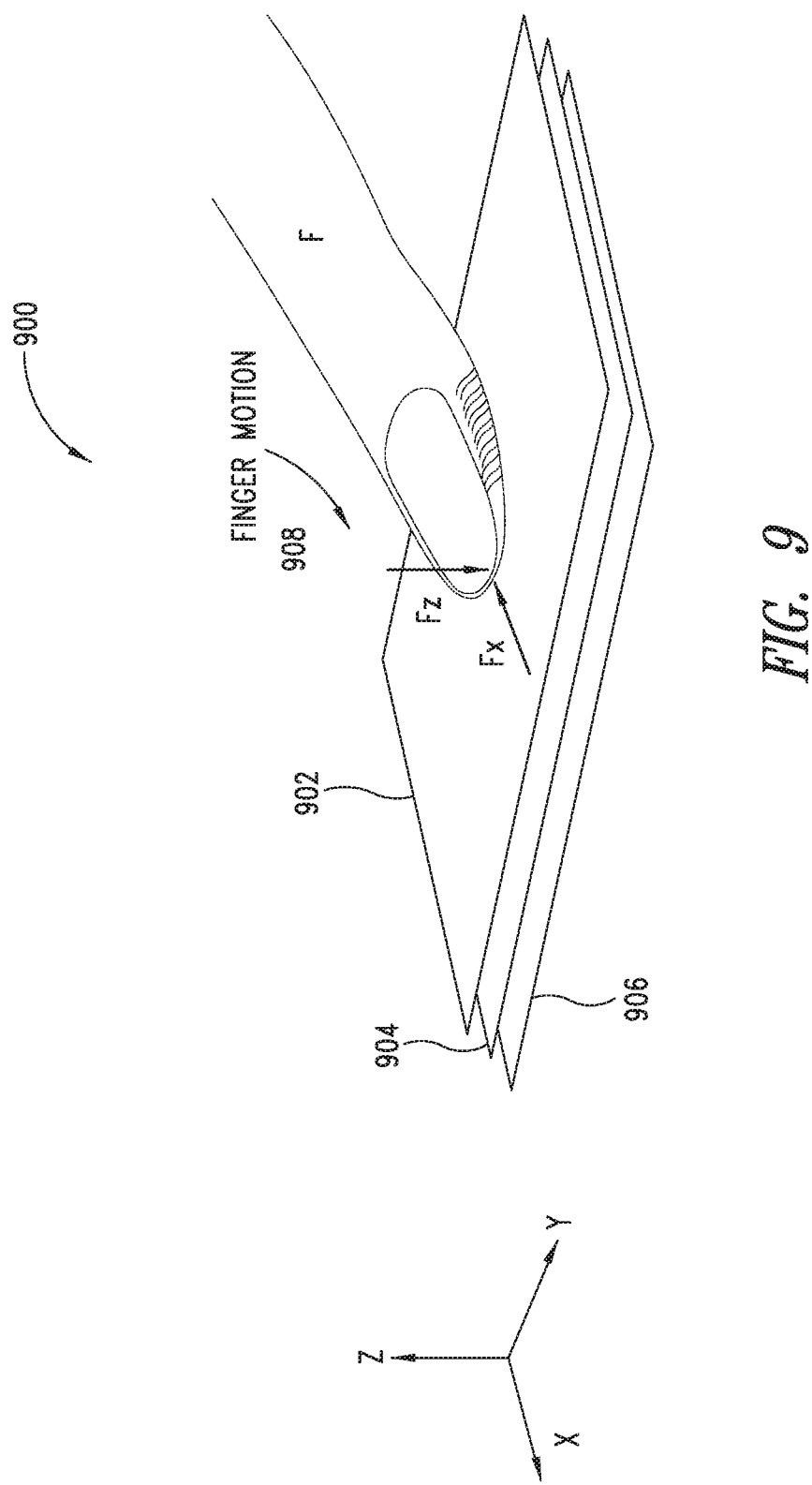
FIG. 9 is a simplified perspective view of a multi-axial sensor showing the multi-layered structure of sensors according to embodiments of the present disclosure.

FIG. 9 is a simplified perspective view of a multi-axial sensor 900 showing the multi-layered structure of sensors according to embodiments of the present disclosure. The multi-axial sensor 900 includes a cap layer 902 that corresponds to the cap 8 in the multi-axial force sensor 1 of FIGS. 1A, 1B and 2 in one embodiment of the multi-axial sensor. A sensor body layer 904 corresponds to the sensor body 2 and a substrate layer 906 corresponds to the substrate 12 in the multi-axial force sensor 1 of FIGS. 1A, 1B and 2 in an embodiment of the multi-axial sensor 900. A finger F is illustrated moving in a finger motion direction indicated by arrow 908 and applying a force to the cap layer 902. A normal component $\vec{fe}$ and a tangential component $\vec{fr}$ associated with the force applied to the cap layer 902 by the finger F are illustrated in FIG. 9. As discussed above in relation to multi-axial force 40 in relation to FIG. 4, multi-axial sensors according to embodiments of the present disclosure sense forces normal to surface of the sensor (XY plane in FIG. 9) and normal to this plane (along the Z-axis in FIG. 9.

FIG. 10 is a more detailed perspective exploded view showing the multiple layers of the multi-layered multi-axial sensor 900 of FIG. 9 according to an embodiment of the present disclosure. The cap layer 902 includes a recess 902a, which corresponds to the recess 10 in the cap 8 in the embodiment of FIGS. 1A, 1B and 2. The sensor body layer 904 includes trenches 904a and 904b corresponding to the trenches 4a and 4b, respectively, formed in the sensor body 2 in the embodiment of FIGS. 1A, 1B and 2. The substrate layer 906 includes a trench 906a, which corresponds to the trench 14 in the substrate 12 in the embodiment of FIGS. 1A, 1B and 2. The sensor 900 includes electrical contacts or pads 904c formed on a surface of the sensor body layer 904 which correspond to the electrical pads 17 in the embodiment of FIGS. 1A, 1B and 2.

FIG. 11 is a top view of the multi-axial sensor 900 of FIG. 10 looking through the cap layer 902 and showing piezoresistive groups 1100a-1100d formed in the sensor body layer 904. The piezo-resistive groups 1100a-d correspond to the piezo-resistive groups 6a, 6b of the first and second sensing units 7a, 7b in the embodiment of FIG. 2. As better illustrated in FIG. 11, the cap layer 902 is smaller than the sensor body layer 904 and substrate layer 906 such that the electrical pads 904c on the surface of the body layer are exposed to allow for electrical connection to the sensor 900. This is better illustrated in FIG. 12, which will now be discussed in more detail.

FIG. 12 is a perspective view of the multi-axial sensor 900 of FIGS. 10 and 11 showing the cap layer 902, sensor body layer 904 and substrate layer 906 properly aligned and positioned on top of one another to form the assembled multi-axial sensor 900. FIG. 12 illustrates the cap layer 902 the sensor body layer 904 and substrate layer 906 being larger than the cap layer 902 so that the electrical pads 904c on the surface of the body layer are exposed to provide the electrical pads 904c for electrical connection to the sensor 900. The FIGS. 9-12 are simplified illustrations of the multi-axial sensor 900 and are provided to illustrate the assembly or construction of the sensor through the multiple layers 902-906 including the components of the sensor. Many of the details of the components of the sensor 900 formed in these layers 902-906 that are described in detail with reference to the embodiments of FIGS. 1A, 1B, 2 and 5-8 are not illustrated in FIGS. 9-12 to simplify these figures. The operation of these components is the same as that previously provided with reference to the embodiments of FIGS. 1A, 1B, 2 and 5-8 and is accordingly not again provided with reference to FIGS. 9-12.

Multi-axial sensors according to embodiments of the present disclosure include no membrane or deflecting part as a main feature of the functionality of the sensor. Instead, multi-axial sensors according to embodiments of the present disclosure include three solid bodies (e.g., the cap layer 902, sensor body layer 904 and substrate layer 906 of FIGS. 9-12) joined together by means of rigid connections. For example, as discussed above in relation to the operation of the embodiments of FIGS. 1A, 1B and 2, due to the fact that the cap 8 is anchored to the sensor body 2 through the first coupling region 16, the relative expansion of the cap 8 on the sensor body 2 caused by a multi-axial applied force F (see arrow 40 in FIG. 4) induces a planar stress distribution at the surface 2a of the sensor body 2, and therefore on the piezoresistive units 19a-19d. The piezoresistive units 19a-d are implemented on the surface 2a of the middle sensor layer (sensor body 2), and excavations (recesses 14 and 10) on the bottom (substrate 12) and top (cap 8) layers are covering a sensitive part of the sensor to provide a mechanical filtering to: 1) remove a vertical component of the force F over the piezoresistive units 19a-19d); and 2) provide a desirable planar stress distribution in the region where each group of the piezoresistive units 19a-19d (see FIG. 2) are located.

In operation of multi-axial force sensors according to embodiments of the present disclosure, such as shown in FIGS. 1A, 1B, 2 and FIGS. 9-12, in response to a normal force Fz applied on a surface of the cap 8 or cap layer 902, an in-plane stress distribution (i.e., a stress distribution in the XY-plane in the embodiments of FIGS. 1A, 1B, 2 and FIGS. 9-12) is induced within the sensitive regions in the XY-plane that will be sensed by all groups of piezoresistive sensing units (units 7a, 7b in FIG. 2) depending on the pattern of the applied load provided by the normal force Fz. Instead, if a shear force in the XY-plane is applied to the surface of the cap 8 (FIG. 1A, 1B) that is considered as an out of plane force component with respect to the sensor middle layer or sensor body 2 (in FIGS. 1A, 1B, 2), there will be a similar effect as above for at least two groups of piezoresistive units 19a-19d (FIG. 2) depending on the direction of the shear force. In addition, there will be also a local rotation within the middle layer (sensor body 2 of FIGS. 1A, 1B, 2) around the axis perpendicular to the direction of the applied shear force, which allows the two other groups of resistors to be insensitive to the applied load.

Embodiments of multi-axial force sensors according to the present disclosure are particularly advantageous in relation to wafer level packaging technologies, such as fan-in and fan-out wafer level chip scale packages (WLCSP) and other suitable wafer level packages. In these wafer level packaging technologies, the sensor itself is also forms a part of the package, as will be appreciated by those skilled in the art. These types of wafer level packages can performed at the wafer level, which makes the manufacturing process even faster and less expensive. Such packages are scalable as well as the sensor itself. In addition, one of the protection layers such as cap 8 could be designed to include application specific integrate circuitry (ASIC) for signal conditioning and acquisition of signals generated by the multi-axial force sensor. The connection from the sensor to the ASIC could be done by "through-silicon via" technology in such an embodiment. Through wafer level packaging the multi-axial force sensor does not require any additional or extra complex packaging for protection or application usage of the sensor.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical transducer, comprising:
a semiconductor body having a first surface and a second surface opposite to one another;
a plurality of trenches extending in the semiconductor body from the first surface towards the second surface, the plurality of trenches including first, second, third, and fourth trenches that are separated from each other,
each of the first, second, third, and fourth trenches including a first portion having a main direction of extension along a first axis, and a second portion having a main direction of extension along a second axis different from and transverse to the first axis,
the first portions of the first and second trenches being aligned with each other along the first axis, the second portions of the first and third trenches being aligned with each other along the second axis, the first portions of the third and fourth trenches being aligned with each other along the first axis, the second portions of the second and fourth trenches being aligned with each other along the second axis;
first, second, third, and fourth piezoresistive sensors at the first surface of the semiconductor body,
the first piezoresistive sensor being positioned between the first portions of the first and second trenches, the second piezoresistive sensor being positioned between the first portions of the third and fourth trenches, the third piezoresistive sensor being positioned between the second portions of the first and third trenches, the fourth piezoresistive sensor being positioned between the second portions of the second and fourth trenches,
the first, second, third, and fourth piezoresistive sensors and the plurality of trenches form an active region,
each of the first and second piezoresistive sensors including first piezoresistive elements and second piezoresistive elements, the first piezoresistive elements having widths extending along the first axis and lengths extending along the second axis such that the first piezoresistive elements have main directions of extensions along the second axis, the second piezoresistive elements having widths extending along the second axis and lengths extending along the first axis such that the second piezoresistive elements have main directions of extensions along the first axis,
the first piezoresistive elements being aligned with the second piezoresistive elements along the first axis, and positioned between two of the second piezoresistive elements,
each of the third and fourth piezoresistive sensors including third piezoresistive elements and fourth piezoresistive elements, the third piezoresistive elements having widths extending along the second axis and lengths extending along the first axis such that the third piezoresistive elements have main directions of extensions along the first axis, the fourth piezoresistive elements having widths extending along the first axis and lengths extending along the second axis such that the fourth piezoresistive elements have main directions of extensions along the second axis, and
the third piezoresistive elements being aligned with the fourth piezoresistive elements along the second axis, and positioned between two of the fourth piezoresistive elements; and
a first structural body mechanically coupled to the first surface of the semiconductor body to form a first sealed cavity which encloses the active region.

2. The microelectromechanical transducer according to claim 1, wherein:
the first and the second piezoresistive sensors are symmetric with respect to a first axis of symmetry parallel to the first axis and passing through a centroid of the first sealed cavity, so that positive force components applied along the second axis induce compressive planar stress to the first piezoresistive sensor and tensile planar stress to the second piezoresistive sensor, whereas negative force components applied along the second axis induce tensile planar stress to the first piezoresistive sensor and compressive planar stress to the second piezoresistive sensor;
the third and the fourth piezoresistive sensors are symmetric with respect to a second axis of symmetry parallel to the second axis and passing through the centroid of the first sealed cavity, so that positive force components applied along the first axis induce compressive planar stress to the third piezoresistive sensor and tensile planar stress to the fourth piezoresistive sensor, whereas negative force components applied along the first axis induce tensile planar stress to the third piezoresistive sensor and compressive planar stress to the fourth piezoresistive sensor.

3. The microelectromechanical transducer according to claim 1, further comprising a first coupling region between the semiconductor body and the first structural body, the first coupling region surrounding the active region and delimiting the first sealed cavity.

4. The microelectromechanical transducer according to claim 1, wherein the first sealed cavity comprises a first recess in the first structural body, the first recess facing the semiconductor body and surrounding the active region.

5. The microelectromechanical transducer according to claim 1, wherein the plurality of trenches are confined within the semiconductor body.

6. The microelectromechanical transducer according to claim 1, wherein the plurality of trenches extend from the first surface to the second surface through the whole thickness of the semiconductor body, the microelectromechanical transducer, further comprising:
a second structural body mechanically coupled to the second surface of the semiconductor body; and
a second sealed cavity between the semiconductor body and the second structural body.

7. The microelectromechanical transducer according to claim 1, wherein the first, second, third, and fourth trenches surround a center portion of the semiconductor body.

8. A microelectromechanical transducer, comprising:
a substrate;
a plurality of trenches extending in to the substrate,
the plurality of trenches including first, second, third, and fourth trenches,
each of the first, second, third, and fourth trenches including a first portion having a main direction of extension along a first axis, and a second portion having a main directions of extension along a second axis transverse to the first axis,
the first portions of the first and second trenches being aligned with each other along the first axis, the second portions of the first and third of trenches being aligned with each other along the second axis, the first portions of the third and fourth trenches being aligned with each other along the first axis, the second portions second and fourth trenches being aligned with each other along the second axis;
first, second, third, and fourth piezoresistive sensors on the substrate,
the first piezoresistive sensor being positioned between the second portions of the first and second trenches, the second piezoresistive sensor being positioned between the second portions of the third and fourth trenches, the third piezoresistive sensor being positioned between the first portions of the first and third trenches, the fourth piezoresistive sensor being positioned between the first portions of the second and fourth trenches,
the first piezoresistive sensor being aligned with the second piezoresistive sensor along the second axis, the third piezoresistive sensor being aligned with the fourth piezoresistive sensor along the first axis,
each of the first, second, third, and fourth piezoresistive sensors including first piezoresistive elements and second piezoresistive elements, the first piezoresistive elements having respective main directions of extensions along the second axis, the second piezoresistive elements having respective main directions of extensions along the first axis.

9. The microelectromechanical transducer according to claim 8, wherein the first, second, third, and fourth trenches are separated from each other by portions of the substrate.

10. The microelectromechanical transducer according to claim 8, wherein the first and second piezoresistive elements of the first piezoresistive sensor are aligned with the first and second piezoresistive elements of the second piezoresistive sensor along the second axis, and the first and second piezoresistive elements of the third piezoresistive sensor are aligned with the first and second piezoresistive elements of the fourth piezoresistive sensor along the first axis.

11. A method of manufacturing a microelectromechanical transducer, the method comprising:
forming a plurality of trenches in a semiconductor body having a first surface and a second surface opposite to one another, the plurality of trenches extending in the semiconductor body from the first surface towards the second surface,
the plurality of trenches including first, second, third, and fourth trenches that are separated from each other,
each of the first, second, third, and fourth trenches including a first portion having a main direction of extension along a first axis, and a second portion having a main direction of extension along a second axis different from and transverse to the first axis,
the first portions of the first and second trenches being aligned with each other along the first axis, the second portions of the first and third trenches being aligned with each other along the second axis, the first portions of the third and fourth trenches being aligned with each other along the first axis, the second portions of the second and fourth trenches being aligned with each other along the second axis;
forming a first, second, third, and fourth piezoresistive sensor and a second piezoresistive sensors at the first surface of the semiconductor body,
the first piezoresistive sensor being positioned between the first portions of the first and second trenches, the second piezoresistive sensor being positioned between the first portions of the third and fourth trenches, the third piezoresistive sensor being positioned between the second portions of the first and third trenches, the fourth piezoresistive sensor being positioned between the second portions of the second and fourth trenches, the first, second, third, and fourth piezoresistive sensors and the plurality of trenches form an active region, each of the first and second piezoresistive sensors including first piezoresistive elements and second piezoresistive elements, the first piezoresistive elements having widths extending along the first axis and lengths extending along the second axis such that the first piezoresistive elements have main directions of extensions along the second axis, the second piezoresistive elements having widths extending along the second axis and lengths extending along the first axis such that the second piezoresistive elements have main directions of extensions along the first axis, the first piezoresistive elements being aligned with the second piezoresistive elements along the first axis, and positioned between two of the second piezoresistive elements, each of the third and fourth piezoresistive sensors including third piezoresistive elements and fourth piezoresistive elements, the third piezoresistive elements having widths extending along the second axis and lengths extending along the first axis such that the third piezoresistive elements have main directions of extensions along the first axis, the fourth piezoresistive elements having widths extending along the first axis and lengths extending along the second axis such that the fourth piezoresistive elements have main directions of extensions along the second axis, and the third piezoresistive elements being aligned with the fourth piezoresistive elements along the second axis, and positioned between two of the fourth piezoresistive elements; and mechanically coupling a first structural body to the first surface of the semiconductor body to form a first sealed cavity enclosing the active region.

12. The method according to claim 11, wherein the first sealed cavity includes a first recess in the first structural body, the first recess facing the semiconductor body and surrounding the active region.

13. The method according to claim 11, wherein the plurality of trenches extend from the first surface to the second surface through the whole thickness of the semiconductor body, the method including:

mechanically coupling a second structural body to the second surface of the semiconductor body to form a second sealed cavity between the semiconductor body and the second structural body.

* * * * *

UNITED STATES PATENT AND TRADEMARK OFFICE
CERTIFICATE OF CORRECTION

PATENT NO. : 11,137,299 B2
APPLICATION NO. : 16/019092
DATED : October 5, 2021
INVENTOR(S) : Abbasi Gavarti et al.

Page 1 of 1

It is certified that error appears in the above-identified patent and that said Letters Patent is hereby corrected as shown below:

In the Claims

Column 15, Claim 8, Line 66:
"second portions second and fourth trenches" should read: --second portions of the second and fourth trenches--.

Column 16, Claim 11, Lines 59-60:
"piezoresistive sensor and a second piezoresistive sensors at the" should read: --piezoresistive sensors at the--.

Signed and Sealed this
Tenth Day of May, 2022

Katherine Kelly Vidal
*Director of the United States Patent and Trademark Office*